United States Patent
Gu et al.

(10) Patent No.: US 11,968,847 B2
(45) Date of Patent: Apr. 23, 2024

(54) PHOTOVOLTAIC MODULE

(71) Applicant: ZHEJIANG JINKO SOLAR CO., LTD., Zhejiang (CN)

(72) Inventors: Chengjun Gu, Zhejiang (CN); Bairu Li, Zhejiang (CN); Menglei Xu, Zhejiang (CN); Jie Yang, Zhejiang (CN); Xinyu Zhang, Zhejiang (CN); Hao Jin, Zhejiang (CN)

(73) Assignee: ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 17/538,236

(22) Filed: Nov. 30, 2021

(65) Prior Publication Data

US 2023/0129635 A1    Apr. 27, 2023

(30) Foreign Application Priority Data

Oct. 26, 2021   (CN) .......................... 202111249794.1

(51) Int. Cl.
    *H10K 30/88* (2023.01)
    *H01L 31/048* (2014.01)
    *H10K 30/10* (2023.01)

(52) U.S. Cl.
    CPC ......... *H10K 30/88* (2023.02); *H01L 31/0481* (2013.01); *H10K 30/10* (2023.02)

(58) Field of Classification Search
    CPC . H01L 51/448; H01L 31/048; H01L 31/0481; H10K 38/88
    See application file for complete search history.

(56) References Cited

U.S. PATENT DOCUMENTS

| 8,601,754 | B2 | 12/2013 | Jenkins et al. |
| 10,457,148 | B2 | 10/2019 | Bullen |
| 2008/0156365 | A1* | 7/2008 | Scholz .................. H01L 31/048 136/251 |
| 2013/0133724 | A1* | 5/2013 | Bae ..................... H01L 31/0488 136/251 |
| 2016/0315209 | A1 | 10/2016 | Wang et al. |

(Continued)

FOREIGN PATENT DOCUMENTS

| CN | 1734794 | 2/2006 |
| CN | 101834146 | 9/2010 |

(Continued)

OTHER PUBLICATIONS

English machine translation of KR1020150086120A (Year: 2023).*

(Continued)

*Primary Examiner* — Angelo Trivisonno
(74) *Attorney, Agent, or Firm* — NIXON PEABODY LLP; Jeffrey L. Costellia

(57) ABSTRACT

Provided is a photovoltaic module, including: a substrate, at least one solar cell string and a packaging portion, wherein a bottom of the packaging portion has a packaging slot, the substrate and the at least one solar cell string are arranged in the packaging slot, the at least one solar cell string is arranged on a top surface of the substrate, a packaging gap is formed between a side surface of the substrate and a side surface of the packaging slot, a first packaging layer is arranged in the packaging gap, and the first packaging layer is configured to seal the packaging gap.

18 Claims, 2 Drawing Sheets

(56) References Cited

U.S. PATENT DOCUMENTS

| | | | |
|---|---|---|---|
| 2018/0244160 A1* | 8/2018 | Bullen | G05F 1/67 |
| 2018/0366601 A1* | 12/2018 | Bogels | B32B 15/08 |
| 2019/0006547 A1* | 1/2019 | Watts | B32B 17/10302 |

FOREIGN PATENT DOCUMENTS

| | | | |
|---|---|---|---|
| CN | 105929676 | | 9/2016 |
| CN | 106129148 | | 11/2016 |
| CN | 108807581 | | 11/2018 |
| CN | 109801997 | | 5/2019 |
| CN | 209526112 | | 10/2019 |
| CN | 210245552 | | 4/2020 |
| CN | 111354809 | | 6/2020 |
| CN | 111763481 | | 10/2020 |
| JP | 2018-098466 | | 6/2018 |
| KR | 1020150086120 A | * | 1/2015 |
| WO | WO-2018/192425 | | 10/2018 |

OTHER PUBLICATIONS

European Search Report for Application No. 21210290.9 dated May 10, 2022, (7 pages).
Chinese Office Action for Application No. 202111249794.1, dated Dec. 3, 2021 (17 pages).
Chinese Office Action for Application No. 2022105526018, dated Apr. 6, 2023 (9 pages).

* cited by examiner

PHOTOVOLTAIC MODULE

CROSS-REFERENCE TO RELATED APPLICATIONS

The present application claims priority to Chinese Patent Application No. 202111249794.1, filed on Oct. 26, 2021, the content of which is incorporated herein by reference in its entirety.

TECHNICAL FIELD

The present disclosure relates to the technical field of solar energy and, in particular, to a photovoltaic module.

BACKGROUND

A photovoltaic module is a device directly converting light energy into electrical energy by photoelectric effect or photochemical effect. The photovoltaic module generally includes a silicon photovoltaic module, a gallium arsenide photovoltaic module, a perovskite photovoltaic modules and other types. The perovskite photovoltaic module, as the most promising photovoltaic cell in the third generation solar cell, has greatly improved its energy conversion efficiency in just a decade, and is expected to play a huge role in the energy field due to its low manufacturing costs.

A packaging technology can isolate a solar cell string in the photovoltaic module from an external environment, prevent pollution and corrosion of various impurities. The packaging technology introduces a method to improve the service life of precision electronic components. However, since materials in the perovskite photovoltaic module are sensitive to water vapor, oxygen and pressure in the air, the current packaging technology cannot meet such requirements, and the service life of the photovoltaic module remains to be improved.

Currently, all packaging cover plates used in cell packaging is flat glass, and full packaging easily causes reaction between an adhesive and a perovskite cell, while edge-sealing packaging is slightly less resistant to water and oxygen.

SUMMARY

A photovoltaic module is provided to solve the technical problems in the related art, which can prevent the intrusion of external water and oxygen, and prevent the contamination of a surface of a solar cell string.

The present disclosure provides a photovoltaic module, including: a substrate, at least one solar cell string and a packaging portion. A bottom of the packaging portion has a packaging slot, the substrate and the at least one solar cell string are arranged in the packaging slot. The at least one solar cell string is arranged on a top surface of the substrate. A packaging gap is formed between a side surface of the substrate and a side surface of the packaging slot. A first packaging layer is arranged in the packaging gap, and the first packaging layer is configured to seal the packaging gap.

In one or more embodiments, a second packaging layer is arranged in the packaging gap, and the second packaging layer is closer to an opening side of the packaging slot than the first packaging layer.

In one or more embodiments, the packaging gap includes a first gap section and a second gap section sequentially communicated from top to bottom. The first packaging layer is configured to seal the first gap section, the second packaging layer is configured to seal the second gap section. A side surface of the first gap section is further away from the substrate than a side surface of the second gap section.

In one or more embodiments, a cross section of the first gap section has a square structure, a wedge structure or an arc structure.

In one or more embodiments, the first packaging layer includes a desiccant or/and a deoxidizer.

In one or more embodiments, a material of the first packaging layer includes one or more of reduced iron powder, sulfite, ascorbic acid, oleic acid, calcium oxide or sodium sulfate.

In one or more embodiments, a material of the second packaging layer includes a polyolefin elastomer (POE) adhesive film, an ethylene vinyl acetate (EVA) adhesive film, a polyisobutylene (PIB) adhesive film, an ultraviolet (UV) adhesive film or an A-B adhesive film.

In one or more embodiments, a side surface of the at least one solar cell string is flush with the side surface of the substrate, and a top surface of the at least one solar cell string fits with a top surface of the packaging slot.

In one or more embodiments, the substrate includes conductive glass, and the at least one solar cell string includes a plurality of perovskite cells or perovskite-crystalline silicon tandem cells.

In one or more embodiments, the packaging portion is made of glass or a transparent plastic material.

In one or more embodiments, the side surface of the substrate and the side surface of the packaging slot are at an equal distance therebetween.

The above description is only a summary of the technical solutions of the present disclosure, in order to be able to understand the technical means of the present disclosure more clearly, the technical means can be implemented according to the contents of the description, furthermore, to make the above and other objectives, features and advantages of the present disclosure more comprehensible, specific embodiments of the present disclosure are descried as follows.

BRIEF DESCRIPTION OF DRAWINGS

Through reading detailed descriptions of the following embodiments, those of ordinary skill in the art may understand various advantages and benefits. The accompanying drawings are merely intended to illustrate objectives of the embodiments, but are not interpreted as limitations on the present disclosure. In addition, the same reference sign is used to indicate the same member throughout the accompanying drawings.

DESCRIPTION OF EMBODIMENTS

Figure 1:
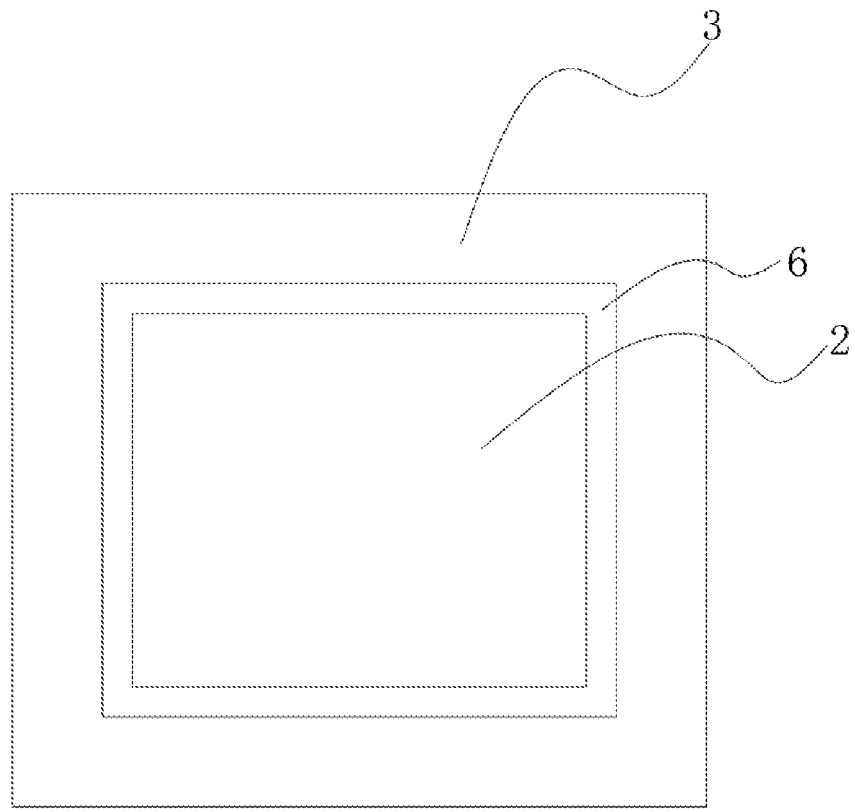
FIG. 1 is a top view of an overall structure according to one or more embodiments of the present disclosure.

Embodiments of the technical solutions of the present disclosure are described in detail below with reference to the accompanying drawings. The following embodiments are intended only to better illustrate the technical solutions of the present disclosure, and are therefore used only as examples and are not intended to limit the protection scope of the present disclosure.

Unless otherwise defined, all technical and scientific terms used herein have the same meaning as commonly understood by those of ordinary skill in the art to which the present disclosure belongs. The terms used in the specification of the present disclosure are intended only to describe particular embodiments and are not intended to limit the present disclosure. Terms such as "include", "comprise", "have" and other variants thereof in the specification and claims of the present disclosure and the above brief description of drawings are intended to cover a non-exclusive inclusion.

In the description of embodiments of the present disclosure, technical terms "first", "second" and the like are intended only to distinguish different objects, which shall not be construed as indicating or implying a relative importance, or implicitly specifying the number, a particular order or primary and secondary relations of the indicated technical features. In the description of embodiments of the present disclosure, "a plurality of" means two or more, unless specifically stated otherwise.

The "embodiments" mentioned herein means that particular features, structures or characteristics described with reference to the embodiments may be included in one or more embodiments of the present disclosure. Phrases appearing at various positions of the specification neither always refer to the same embodiments, nor separate or alternative embodiments that are mutually exclusive with other embodiments. It is explicitly and implicitly understood by those skilled in the art that the embodiments described herein may be combined with other embodiments.

In the description of embodiments of the present disclosure, the term "and/or" is merely an association relationship describing associated objects, indicating that three relationships may exist. For example, A and/or B indicates that there are three cases of A alone, A and B together, and B alone. In addition, the character "/" herein generally means that associated objects before and after "/" are in an "or" relationship.

In the description of embodiments of the present disclosure, the term "a plurality of" means two or more. Similarly, "a plurality of groups" means two or more groups, and "a plurality of pieces" means two or more pieces.

In the description of embodiments of the present disclosure, the orientation or position relationship indicated by the technical terms "central", "longitudinal", "transverse", "length", "width", "thickness", "upper", "lower", "front", "back", "left", "right", "vertical", "horizontal", "top", "bottom", "inner", "outer", "clockwise", "counterclockwise", "axial", "radial", "circumferential", etc. are based on the orientation or position relationship shown in the accompanying drawings and are only intended to facilitate the description of embodiments of the present disclosure and simplify the description, rather than indicating or implying that the device or element referred to must have a particular orientation or be constructed and operated in a particular orientation, and therefore are not to be interpreted as limitations on the embodiments of the present disclosure.

In the description of embodiments of the present disclosure, unless specifically stated and limited, the technical terms "mounting," "coupling", "connecting" and "fixing" should be understood in a broad sense, such as, a fixed connection, a detachable connection, or an integral connection; a mechanical connection or an electrical connection; a direct connection, an indirect connection through an intermediate medium, an internal connection of two elements, or an interaction of two elements. For those of ordinary skill in the art, the specific meanings of the above terms in embodiments of the present disclosure can be understood on case-by-case.

Perovskite solar cells have attracted great attention in academic circles because of their characteristics such as high photoelectric conversion efficiency, low cost solution processing and abundant resources. The current world record for efficiency is 25.5%. They are at a same level as crystalline silicon cells, CdTe cells and copper indium gallium Selenium (CIGS) cells. Due to their great scientific significance and great development prospect, perovskite cells were named as one of the top ten scientific breakthroughs in 2013 by Science magazine.

However, the applicant noted that an adhesive may have corrosion reaction with the perovskite cells during a high-temperature packaging process and after cooling, resulting in attenuation of electrical performance parameters of a perovskite cell core plate in a short period of time, leaving serious potential risks, and greatly reducing the service life of a perovskite solar cell module.

In consideration of the above, in order to solve the technical problems that full packaging easily causes reaction between an adhesive and a perovskite cell while edge-sealing packaging is slightly less resistant to water and oxygen, the present disclosure provides a new method for packaging a photovoltaic module. In the photovoltaic module, a space between a side surface of a substrate 1 and a side surface of a packaging slot 4 is filled with a first packaging layer 6 capable of absorbing water and oxygen, so as to prevent the intrusion of external water and oxygen and also to prevent contact of the first packaging layer 6 with a surface of a solar cell string 2.

Figure 2:
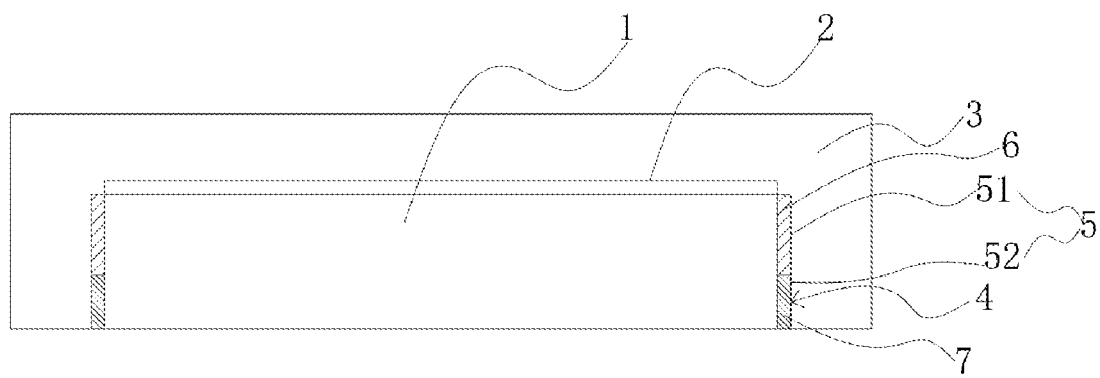
FIG. 2 is a sectional view of the overall structure according to one or more embodiments of the present disclosure.

According to some embodiments of the present disclosure, referring to FIG. 1 and FIG. 2, the present disclosure provides a photovoltaic module, including a substrate 1, at least one solar cell string 2 and a packaging portion 3. Due to the poor stability of existing perovskite solar cells to moisture and oxygen, a perovskite layer is easy to decompose and fail in an atmospheric environment. As a result, the solar cell string 2 and the substrate 1 are packaged by the packaging portion 3 to achieve the purpose of isolating external water and oxygen. In some embodiments, the packaging portion 3 is made of glass or a transparent plastic material to isolate external impurities and facilitate the passage of light. A bottom of the packaging portion 3 has a packaging slot 4. After the photovoltaic module is mounted, the bottom of the packaging portion 3 is farther away from sunlight than the top of the packaging portion 3 during normal use. The bottom of the packaging portion 3 is generally close to a building wall. The packaging slot 4 is formed by depression of a bottom surface of the packaging portion 3. The substrate 1 and the solar cell string 2 are arranged in the packaging slot 4. The packaging slot 4 is a cavity formed inside the packaging portion 3 to accommodate the substrate 1 and the solar cell string 2. The substrate 1 and the solar cell string 2 are completely received in the packaging slot 4.

The solar cell string 2 is arranged on a top surface of the substrate 1. In some embodiments, the substrate 1 may be a substrate 1 made of a conductive material, and the solar cell string 2 includes perovskite cells. That is, the substrate 1 not only carries the solar cell string 2, but also acts as an anode to collect electrons generated by the solar cell string 2 after illumination. In some embodiments, the substrate 1 may be made of fluorine-doped tin-oxide conductive glass or indium-tin oxide conductive glass.

In some embodiments, the solar cell string 2 includes perovskite cells. A plurality of perovskite cells are connected in series and/or in parallel to form the solar cell string 2. In some embodiments, the perovskite cell includes for example an electron transport layer, a perovskite layer, a hole transport layer and a metal electrode. When exposed to sunlight, the perovskite layer first absorbs photons to create electron-hole pairs. Non-recombined electrons and holes are collected by the electron transport layer and the hole transport layer, respectively. That is, the electrons are transported from the perovskite layer to the electron transport layer, and are eventually collected by the substrate 1. The holes are transported from the perovskite layer to the hole transport layer and are eventually collected by the metal electrode. Finally, a photocurrent is generated through a circuit connecting the substrate 1 to the metal electrode. A perovskite material has a lower carrier recombination probability and a higher carrier mobility, and carriers have a longer diffusion distance and a longer lifetime. Therefore, a perovskite cell film has higher photoelectric conversion efficiency.

In other embodiments, the solar cell string 2 may also include perovskite-crystalline silicon tandem cells.

The perovskite-crystalline silicon tandem cells may efficiently utilize a solar spectrum. Wide-bandgap perovskites absorb a short-wave portion of sunlight so as to reduce thermal-electron losses. Narrow-bandgap crystalline silicon absorbs a long-wave portion so as to expand a spectral response of the solar cell and reduce long-wave losses. The perovskite-crystalline silicon tandem cells may broaden a spectral response range of the cell and improves the efficiency of the solar cell, as well as reduce manufacturing costs. In order to achieve the purpose of preventing the intrusion of external water and oxygen and preventing contamination of the solar cell string 2. A packaging gap 5 is formed between a side surface of the substrate 1 and a side surface of the packaging slot 4. The packaging gap 5 is filled with a first packaging layer 6. The first packaging layer 6 is configured to seal the packaging gap 5. An outer profile of the first packaging layer 6 matches an inner profile of the packaging gap 5 to fill in and seal the packaging gap 5, so as to form an isolation section to isolate the intrusion of water and oxygen from the bottom up into the solar cell string 2. In addition, the first packaging layer 6 is located on the side surface of the substrate 1 and is not in contact with the solar cell string 2, so as to prevent contamination of the solar cell string 2.

According to some embodiments of the present disclosure, as shown to FIG. 1, in order to further prevent the intrusion of water and oxygen, the substrate 1 is stably fixed in the packaging slot 4, and a second packaging layer 7 is arranged in the packaging gap 5. The second packaging layer 7 mainly plays a role of bonding to bond the substrate 1 to the packaging portion 3 to form an entirety, so as to facilitate the mounting of the photovoltaic module. The second packaging layer 7 is closer to an opening side of the packaging slot 4 than the first packaging layer 6. The second packaging layer 7 may also play a role of preventing escape of the first packaging layer 6 to ensure a function of isolating water and oxygen.

Figure 3:
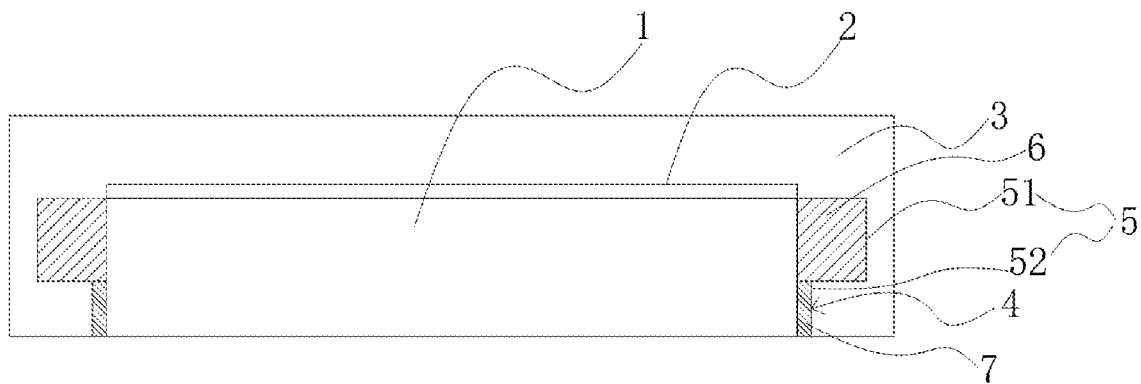
FIG. 3 is a sectional view when a first gap section is in a shape of a square according to one or more embodiments of the present disclosure.
Figure 4:
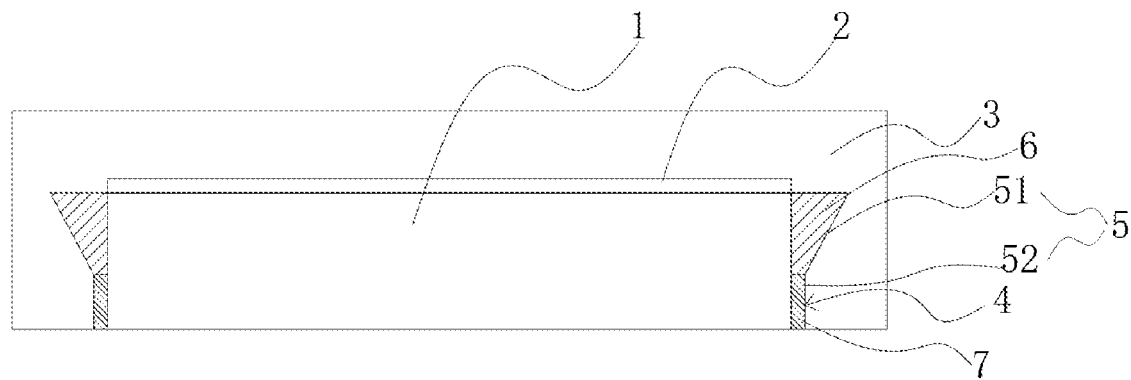
FIG. 4 is a sectional view when the first gap section is in a shape of a wedge according to one or more embodiments of the present disclosure.
Figure 5:
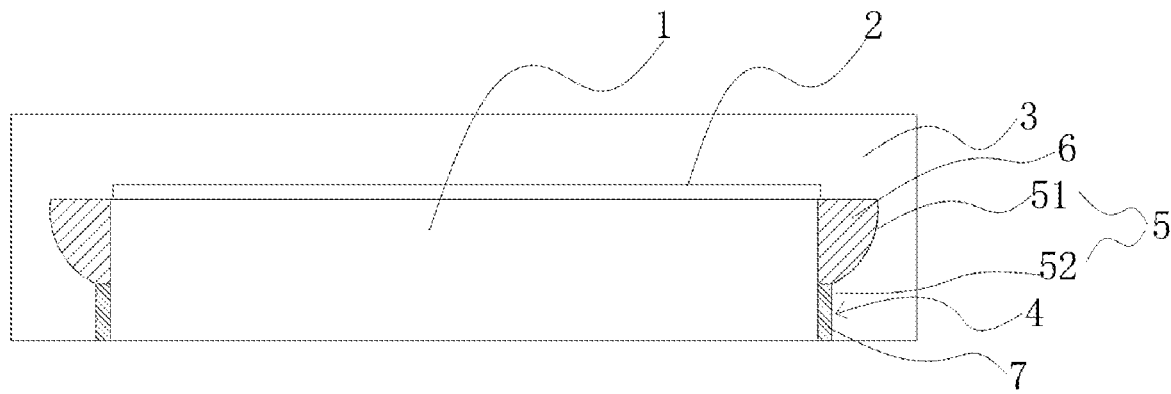
FIG. 5 is a sectional view when the first gap section is in a shape of quadrant according to one or more embodiments of the present disclosure.

According to some embodiments of the present disclosure, as shown in FIG. 3 to FIG. 5, the packaging gap 5 includes a first gap section 51 and a second gap section 52 sequentially communicated from top to bottom. The first gap section 51 is closer to the solar cell string 2. That is, an inner wall surface of the packaging slot 4 is not a vertical surface. A slot is recessed near the solar cell string 2. The first gap section 51 is formed between an inner wall surface of the slot and the side surface of the substrate 1, while the second gap section 52 is formed between the inner wall surface of the packaging slot 4 and the side surface of the substrate 1. The first gap section 51 is filled with the first packaging layer 6. The first packaging layer 6 is configured to seal the first gap section 51. The second gap section 52 is filled with the second packaging layer 7. The second packaging layer 7 is configured to seal the second gap section 52. In a horizontal direction, a size of the first gap section 51 is greater than the second gap section 52. That is, a side surface of the first gap section 51 is further away from the substrate 1 than a side surface of the second gap section 52. In some embodiments, a cross section of the first gap section 51 includes a square, wedge or arc structure. The arc may be a structure of a quadrant. The first gap section 51 in the above shapes has a larger space to be filled with more materials of the first packaging layer 6, which has a prolonged effect of preventing the intrusion of water and oxygen and is durable. Moreover, since a height of the first gap 51 is constant, the height of the first packaging layer 6 can be more accurately controlled when the first gap section 51 is filled with the material of the first packaging layer 6. In addition, since an area of contact between the first packaging layer 6 and water and oxygen is increased, the first packaging layer 6 also absorbs water oxygen more efficiently. Those skilled in the art know that the structure of the first gap section 51 is not limited to the above examples, and may also have more slot structures, provided that an effect of increasing an amount of filling can be achieved.

According to some embodiments of the present disclosure, the material of the first packaging layer 6 includes a desiccant or/and a deoxidizer. In some examples, only a desiccant or a deoxidizer is provided, or both are used together to improve the performance of isolating water and oxygen. One or more materials of reduced iron powder, sulfite, ascorbic acid, oleic acid, calcium oxide and sodium sulfate can react with water and oxygen to prevent the intrusion of water and oxygen. Ascorbic acid or oleic acid acts as the deoxidizer, calcium oxide or sodium sulfate acts as the desiccant, reduced iron powder and sulfite can react with water and oxygen, which acts as the desiccant and the deoxidizer at the same time. Those skilled in the art know that the material of the first packaging layer 6 is not limited to mixtures of one or more of the examples, and may also include more other materials that can block water and oxygen, which is not limited herein.

The first packaging layer 6 has a height ranging from 3 mm to 20 mm. It is to be noted that, if the height of the first packaging layer 6 is excessively small, the packaging may not be tight. If a width is excessively large, a height of the photovoltaic module may be increased. Therefore, the first packaging layer 6 having a height ranging from 3 mm to 20 mm can prevent the above-mentioned problems.

According to some embodiments of the present disclosure, a material of the second packaging layer 7 includes a polyolefin elastomer (POE) adhesive film, an ethylene vinyl acetate (EVA) adhesive film, a polyisobutylene (PIB) adhesive film, an ultraviolet (UV) adhesive film or an A-B adhesive film. Those skilled in the art know that the material of the second packaging layer 7 is not limited to the above examples, and may also be more other materials that can play a role of bonding and fixing, which is not limited herein. In some other embodiments, the material of the second packaging layer 7 may be the same as the material of the first packaging layer 6.

The second packaging layer 7 has a height ranging from 3 mm to 20 mm. It is to be noted that, if the height of the second packaging layer 7 is excessively small, the packaging may not be tight. If a width is excessively large, a height of the photovoltaic module may be increased. Therefore, the second packaging layer 7 having a height ranging from 3 mm to 20 mm can prevent the above-mentioned problems.

According to some embodiments of the present disclosure, a side surface of the solar cell string 2 is flush with the side surface of the substrate 1. That is, an outer profile of the solar cell string 2 is consistent with that of the substrate 1, which are square structures of a same size in some embodiments, so as to facilitate molding. A top surface of the solar cell string 2 fits with a top surface of the packaging slot 4. The top surface of the substrate 1 and the top surface of the packaging slot 4 are attached to upper and lower sides of the solar cell string 2, so that the solar cell string 2 can be clamped and fixed, which facilitates the mounting of the photovoltaic module and prevents the failure of parts caused by the movement of the solar cell string 2.

According to some embodiments of the present disclosure, as shown FIG. 1 and FIG. 2, an inner profile of the packaging slot 4 matches an outer profile of the substrate 1, so that the side surface of the substrate 1 and the side surface of the packaging slot 4 are at an equal distance. In some embodiments, the substrate 1 is of a square structure, and the packaging slot 4 is also a square slot. In this way, the packaging gap 5 around the substrate 1 remains the same, which is convenient for quantitative filling, preventing erosion of the solar cell string 2 caused by too much local filling, or preventing the weakening resistance to water and oxygen caused by too little local filling. Those skilled in the art know that the structure of the substrate 1 may be deformed in other ways, and the shape of the packaging slot 4 may also change accordingly, so that the packaging gap 5 around the substrate 1 remains the same, which is not limited herein.

Compared with the related art, in the present disclosure, a space between the side surface of the solar cell string 2 and the side surface of the packaging slot 4 is filled with the first packaging layer 6 capable of absorbing water and oxygen, so as to prevent the intrusion of external water and oxygen and to prolong the service life of the photovoltaic module. The side surface of the glass substrate 1 rather than the surface of the solar cell string 2 is filled with the first packaging layer 6, to block water oxygen and also to prevent contact with the surface of the solar cell string 2. This filling manner increases a distance of diffusion of water and oxygen from the outside to the surface of the solar cell string 2 and further prevents the intrusion of water and oxygen by using the first packaging layer 6.

The above embodiments are merely intended for describing the technical solutions of the present disclosure rather than limiting the present disclosure. Although the present disclosure is described in detail with reference to the above embodiments, those of ordinary skill in the art should understand that they may still make modifications to the technical solutions described in the above embodiments or make equivalent replacements to some or all of the technical features thereof, and such modifications or replacements do not cause the essence of the corresponding technical solutions to depart from the spirit and scope of the technical solutions of the embodiments of the present disclosure, all of which should fall within the scope of the claims and descrip-tion of the present disclosure. In particular, the technical features mentioned in various embodiments can be combined in any manner provided that there is no structural conflict. The present disclosure is not limited to the specific embodiments disclosed herein, but includes all technical solutions falling into the protection scope of the claims.

What is claimed is:

1. A photovoltaic module, comprising:
   a substrate,
   at least one solar cell string and an integrally formed packaging portion,
   wherein a packaging slot is formed within a bottom side surface of the packaging portion, in a direction from bottom to top of the photovoltaic module, the substrate and the at least one solar cell string are sequentially received in the packaging slot, and a bottom side surface of the substrate is flush with the bottom side surface of the packaging portion, the at least one solar cell string is arranged on a top surface of the substrate,
   a packaging gap is formed between a side surface of the substrate and an inner side surface of the packaging slot, a second packaging layer and a first packaging layer are sequentially arranged in the packaging gap in the direction from bottom to top of the photovoltaic module, the first packaging layer and the second packaging layer are configured to seal the packaging gap,
   the second packaging layer is closer to an opening side of the packaging slot than the first packaging layer, the opening side is located at the bottom of the packaging portion and is recessed towards the direction from bottom to top of the photovoltaic module and opening towards the bottom side surface of the packaging portion,
   wherein the packaging gap includes a first gap section and a second gap section communicated to each other along a direction from top to bottom of the substrate, the first packaging layer is configured to fill up and seal the first gap section, the second packaging layer is configured to fill up and seal the second gap section, and a side surface of the first gap section is further away from the substrate than a side surface of the second gap section,
   wherein the bottom side surface of the packaging portion is away from sunlight illumination than a top side surface of the packaging portion.

2. The photovoltaic module according to claim 1, wherein a cross section of the first gap section has a square structure, a wedge structure or an arc structure.

3. The photovoltaic module according to claim 1, wherein the first packaging layer comprises a desiccant or/and a deoxidizer.

4. The photovoltaic module according to claim 3, wherein a material of the first packaging layer comprises one or more of reduced iron powder, sulfite, ascorbic acid, oleic acid, calcium oxide or sodium sulfate.

5. The photovoltaic module according to claim 1, wherein a material of the first packaging layer comprises one or more of reduced iron powder, sulfite, ascorbic acid, oleic acid, calcium oxide or sodium sulfate.

6. The photovoltaic module according to claim 1, wherein a material of the second packaging layer comprises a polyolefin elastomer (POE) adhesive film, an ethylene vinyl acetate (EVA) adhesive film, a polyisobutylene (PIB) adhesive film, an ultraviolet (UV) adhesive film or an A-B double-component adhesive film.

7. The photovoltaic module according to claim 1, wherein a side surface of the at least one solar cell string is flush with the side surface of the substrate, and a top surface of the at least one solar cell string is flush with a top surface of the packaging slot.

8. The photovoltaic module according to claim 1, wherein the substrate includes conductive glass, and the at least one solar cell string includes a plurality of perovskite cells or perovskite-crystalline silicon tandem cells.

9. The photovoltaic module according to claim 1, wherein the packaging portion is made of glass or a transparent plastic material.

10. The photovoltaic module according to claim 1, wherein a gap between the side surface of the substrate and the side surface of the packaging slot has a constant width.

11. The photovoltaic module according to claim 1, wherein the first packaging layer has a height ranging from 3 mm to 20 mm.

12. The photovoltaic module according to claim 1, wherein the second packaging layer has a height ranging from 3 mm to 20 mm.

13. The photovoltaic module according to claim 7, wherein the substrate and the solar cell string are completely received in the packaging slot.

14. The photovoltaic module according to claim 2, wherein the arc structure is a structure of a quadrant.

15. The photovoltaic module according to claim 1, wherein the first packaging layer is located at the side surface of the substrate and is not in contact with the solar cell string.

16. The photovoltaic module according to claim 9, wherein the packaging portion is made of fluorine-doped tin-oxide conductive glass or indium-tin oxide conductive glass.

17. The photovoltaic module according to claim 1, wherein along a thickness direction of the module, the at least one solar cell string is positioned entirely above the first packaging layer, and the first packaging layer is positioned entirely above the second packaging layer.

18. The photovoltaic module according to claim 1, wherein the at least one solar cell is not in contact with the first packaging layer.

* * * * *